(12) United States Patent
Gregor et al.

(10) Patent No.: US 10,319,459 B1
(45) Date of Patent: Jun. 11, 2019

(54) CUSTOMIZABLE BUILT-IN SELF-TEST TESTPLANS FOR MEMORY UNITS

(71) Applicant: Cadence Design Systems, Inc., San Jose, CA (US)

(72) Inventors: Steven Lee Gregor, Oswego, NY (US); Puneet Arora, Noida (IN); Norman Robert Card, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 23 days.

(21) Appl. No.: 15/636,332

(22) Filed: Jun. 28, 2017

(51) Int. Cl.
*G11C 29/00* (2006.01)
*G11C 29/38* (2006.01)
*G11C 29/36* (2006.01)
*G01R 31/317* (2006.01)

(52) U.S. Cl.
CPC ........ *G11C 29/38* (2013.01); *G01R 31/31703* (2013.01); *G01R 31/31723* (2013.01); *G11C 29/36* (2013.01)

(58) Field of Classification Search
None
See application file for complete search history.

(56) References Cited

U.S. PATENT DOCUMENTS

| 8,677,196 | B1* | 3/2014 | Gregor | G11C 29/1201 |
| | | | | 714/718 |
| 9,640,279 | B1* | 5/2017 | Popps | G11C 29/16 |
| 2002/0138801 | A1* | 9/2002 | Wang | G01R 31/31704 |
| | | | | 714/729 |
| 2003/0120974 | A1* | 6/2003 | Adams | G06F 11/2242 |
| | | | | 714/31 |
| 2010/0174955 | A1* | 7/2010 | Carnevale | G11C 5/04 |
| | | | | 714/718 |
| 2013/0055023 | A1* | 2/2013 | Chong | G11C 29/56008 |
| | | | | 714/30 |
| 2016/0365157 | A1* | 12/2016 | Sang | G11C 29/40 |
| 2017/0115353 | A1* | 4/2017 | Sonawane | G01R 31/31701 |

* cited by examiner

*Primary Examiner* — Daniel F. McMahon
(74) *Attorney, Agent, or Firm* — Tarolli, Sundheim, Covell & Tummino LLP

(57) ABSTRACT

An exemplary memory arrangement can be provided, which can include, for example, a memory(ies), and an algorithmic memory unit(s) (AMU) coupled to the memory(ies), wherein the AMU includes a programmed testplan algorithm(s) configured to test the memory(ies). The AMU(s) can further include a hardwired testplan(s) configured to test the memory(ies). A Joint Test Action Group ("JTAG") controller may be coupled to the AMU(s), which can be configured to access logic of the programmed testplan algorithm(s). A direct access controller (DAC) can be coupled to the AMU(s), which can be configured to access internal nodes in the AMU(s). The DAC can be configured to activate the programmed testplan algorithm(s) using a minimally direct access pin interface in the AMU(s).

20 Claims, 15 Drawing Sheets

```
{
  module { sram128x16 } {
          read_delay 2
          address_partition { row 7:2 column 1:0 }
          port_alias {
                   cen              CEN
                   a                A
                   d                D
                   wen              WEN
                   q                Q
                                    ECC_en
          }
          port_access {
                   assign RDT 0
                   assign WDT 0
                   assign         1
                   sample SBE 0
                   sample UE 0
          }
``` base_port names → (cen, a, d, wen, q)

port_access label → (ECC_en area)

Figure 8

CUSTOMIZABLE BUILT-IN SELF-TEST TESTPLANS FOR MEMORY UNITS

FIELD OF THE DISCLOSURE

The present disclosure relates generally to built-in test plans for memory units, and more specifically, to exemplary system, method, computer-accessible mediums, and memory units having customized embedded testplans.

BACKGROUND INFORMATION

Embedded memories may consume 50% or more of a die area, which is expected to increase in the coming years. New models are being generated to test algorithms or procedures on the memory units. However, traditional algorithms and procedures fall short in stressing and detecting faulty memory models. Further, flexibility may be beneficial in test procedures to assure that any algorithms or procedures meet all, or most, encountered faults. Generating test algorithms may present many issues, including trade-offs to manage overhead, pipelining, power, and tester runtime. Thus, there is a need for a robust failure analysis tool to assure memory yields may be raised to an acceptable level.

Generally, a memory unit will have a common set of interface pins. For example, the interface pins may include an address, data in, data out, and various types of control signals for managing the read and write operations for the memory. Additional features have been added that may perform special functions, which may include forcing an operation to take longer on a read or write access (e.g., margin test), where the internal circuitry is adjusted to determine if a failure is close or imminent. In order to force the operation to take longer, additional resistance may be added into the memory. Further, the memory may include power down modes, which may power down the peripheral circuitry, but leave the content of the memory in place. It is also beneficial to reduce the power consumption, or increase the testability of the memory. However, while memory units have been designed with a robust test suite, the available test procedures are limited, and cannot be customized by the user testing the memory.

As more and more functionality is getting integrated into system-on-chip ("Sort") designs, there is a steady increase in the amount of memories present on the chip. Based on the International Technology Roadmap for Semiconductors ("ITRS"), it can be as high as 90% of the chip area. Moreover, the density of the memories may be highest on a semiconductor chip. Thus, to ensure that the chip is of a sufficient quality, the memory must also be determined to be a similar quality. However, with changes in semiconductor technologies, starting from MOS, moving on to CMOS, SOI, and FINFET, and with technology moving to smaller and smaller geometries, it is hard to predict what kind of defects may be present inside a memory on a chip.

Currently, when testing a memory, a designer is provided with a predefined set of testplans by the testplan designer. However, these testplans may be limited in number, and may not be sufficient to test all possible scenarios that a designer may wish to test. Further, it is currently burdensome to add new testplans based on user input, as the testplans have to be hardwired into the memory controller.

To avoid field returns, user should be able to detect and diagnose these failures. In order to achieve this goal, a small piece of hardware, memory-built-in-self-test ("MBIST") logic may be made part of the chip. This on-chip hardware may generate a series of read and write operations, also known as algorithms, to test the memories. These algorithms need to be written in a design language (e.g., a hardware design language), which may need an underlying hardware implementation of this grammar. Since user needs to design their own algorithms for testing purposes, the simpler the grammar, the better it is for the user to adopt and write new algorithms with minimum dependency on the vendor providing the MBIST solution. At the same time, it may be implemented with less hardware as it may reduce the area overhead.

Thus, it may be beneficial to provide an exemplary extended test support feature, which may be used in conjunction with the various features that may be incorporated into a memory.

SUMMARY

An exemplary memory arrangement may be provided, which may include, for example, a memory(ies), and an algorithmic memory unit(s) (AMU) coupled to the memory(ies), wherein the AMU includes a programmed testplan algorithm(s) configured to test the memory(ies). The AMU(s) may further include a hardwired testplan(s) configured to test the memory(ies). A Joint Test Action Group ("JTAG") controller may be coupled to the AMU(s), which may be configured to access logic of the programmed testplan algorithm(s) and the hardwired testplan algorithm(s). A direct access controller (DAC) may be coupled to the AMU(s), which may be configured to access internal nodes in the AMU(s). The DAC may be configured to activate the programmed testplan algorithm(s) or the hardwired testplan algorithm(s) using a minimally direct access pin interface in the AMU(s).

In some exemplary embodiments of the present disclosure, the DAC may be configured to activate the testplan algorithm(s) using an external port interface(s) in the AMU(s). The AMU(s) may include a plurality of block-level interface ports. The hardwired testplan(s) may be fixed. The programmed testplan algorithm(s) may be changeable.

In certain exemplary embodiments of the present disclosure, the programmed testplan algorithm(s) or the hardwired testplan(s) may be based on a simple instruction set or a complex instructions set. The programmed testplan algorithm(s) or the hardwired testplans may be based on (i) address_orders, (ii) address updates, or (iii) data backgrounds.

A further exemplary embodiment of the present disclosure may include an exemplary system, method and computer-accessible medium for modifying an algorithmic memory unit(s) (AMU), which may include, for example, hardwiring the AMU(s) to include a hardwired testplan(s) configured to test a memory(ies), receiving a programmed testplan algorithm(s) configured to test the memory(ies), and programming the AMU(s) to include the programmed testplan algorithm(s) after the AMU(s) has been hardwired to include the hardwired testplan(s). The hardwired testplan(s) or the programmed testplan algorithm(s) may be initiated. The programmed testplan algorithm(s) may be initiated using a Joint Test Action Group (JTAG) controller or a direct access controller (DAC). The programmed testplan algorithm(s) may be initiated using the DAC by accessing internal nodes in the AMU(s) or accessing external port interface(s) in the AMU(s). The programmed testplan algorithm(s) may be received from a user. The programmed test plan algorithm(s) may be modified.

A further exemplary embodiment of the present disclosure may include a method for modifying algorithmic memory unit(s) (AMU), which may include, for example, providing the AMU(s), and programming the AMU(s) to include a programmed testplan algorithm(s). Access to a plurality of pins on a boundary of the AMU(s) may be provided. The programmed testplan algorithm(s) may be modified. A test of a memory unit coupled to the AMU(s) may be performed using the programmed testplan algorithm(s).

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 8 is an exemplary diagram illustrating exemplary code for base port names and port access labels according to an exemplary embodiment of the present disclosure;

Figure 1:
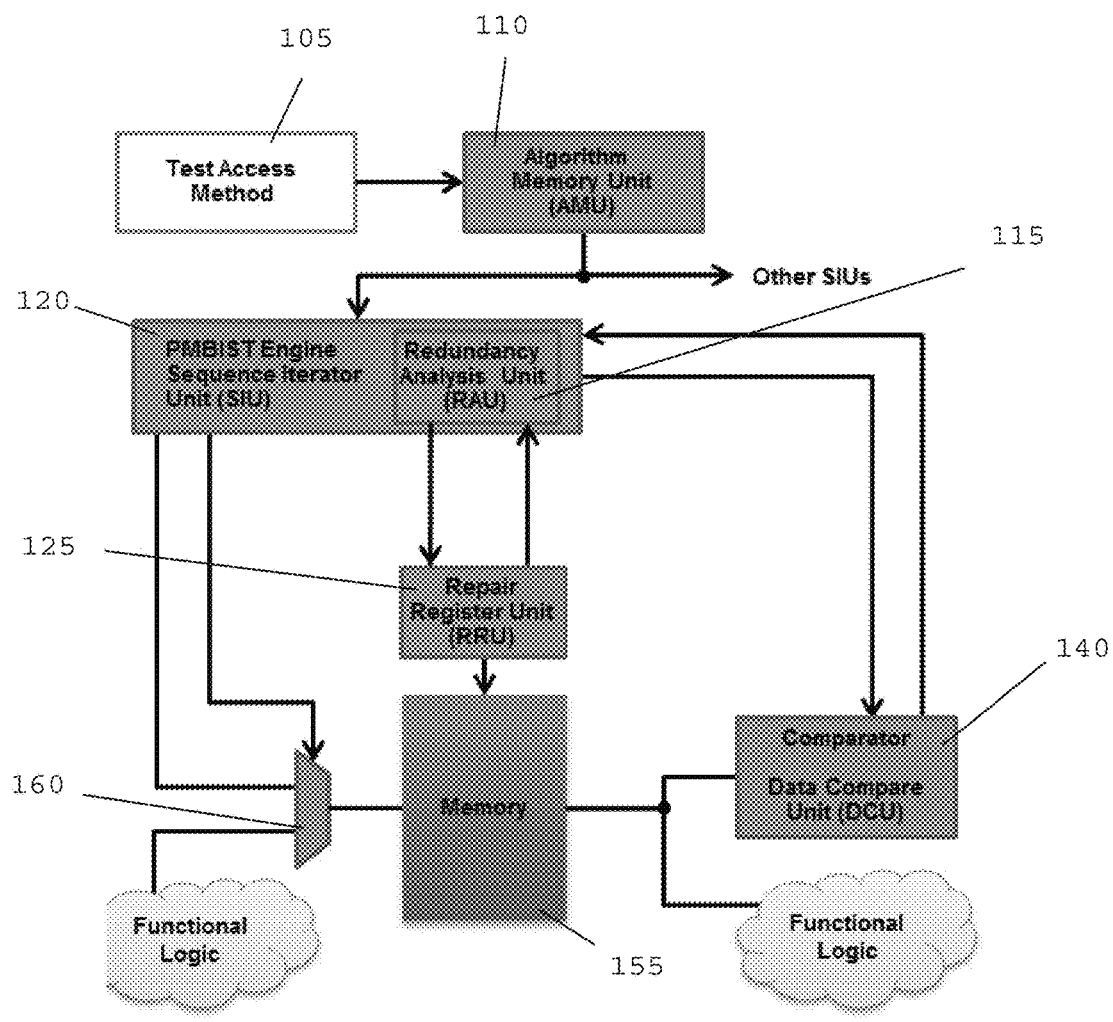
FIG. 1 is an exemplary schematic diagram of the exemplary system, method and computer-accessible medium, according to an exemplary embodiment of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION

The exemplary system, method, and computer-accessible medium, according to an exemplary embodiment of the present disclosure, may include a programmable memory built-in self-test ("PMBIST"). FIG. 1 illustrates an exemplary test access method ("TAM") 105 for a memory with a PMBIST, according to an exemplary embodiment of the present disclosure. TAM 105 may interface with algorithmic memory unit ("AMU") 110. AMU 110 may be compiled with various user-defined algorithms, which may be used to test the memory unit. AMU 110 may be shared across multiple sequence iterator units ("SIUs") (e.g., PMBIST Engine SIU 120) or other SIUs. The size of AMU 110 may be adjusted during compile time, and it may include a selection of programmable algorithms in testplan, and a selection of hardwired or programmed testplans. The size of AMU 110 may also be affected by the number of user defined programmed algorithms, which are discussed below. Additionally, AMU 110 may function across a number of clock domains.

PMBIST Engine SIU 120 may include logic for a configurable and optimized address generation, control signal interface, and data background generation. It may include a single sequence iterator shift register and control logic utilized to execute the commands in the sequence iterator once initiated. PMBIST Engine SIU 120 may interface with data compare unit ("DCU") 140, which may be shared across different types of memories. DCU 140 may determine failures by comparing data read from memory with expected values from a test algorithm. The signal from the comparator may indicate when a mis-compare has occurred.

A repair register unit ("RRU") 125 may be assigned to each repairable memory or solution group (e.g., for memory 155). PMBIST Engine SIU 120 may also interface directly with memory 155 through multiplexer 160.

Exemplary features of the exemplary system, method and computer-accessible medium, may include:
  i) a unified PMBIST engine;
  ii) support for embedded SRAMs, ROMs, Register Files, unrestricted multiple port;
  iii) a flexible interface: JTAG and Direct Access controllers;
  iv) rich hardcoded algorithms, which may be user-defined;

v) programmable algorithms, which may be applied during runtime, and which may be user-defined;
vi) multi-block bottom up flow;
vii) a diagnostics enablement;
viii) a built-in redundancy analysis;
ix) a built-in self-repair (e.g., soft repair);
x) SDC Generation; and
xi) an embedded memory bus.

Exemplary Multi-Block Bottom-Up Flow

Figure 2A:
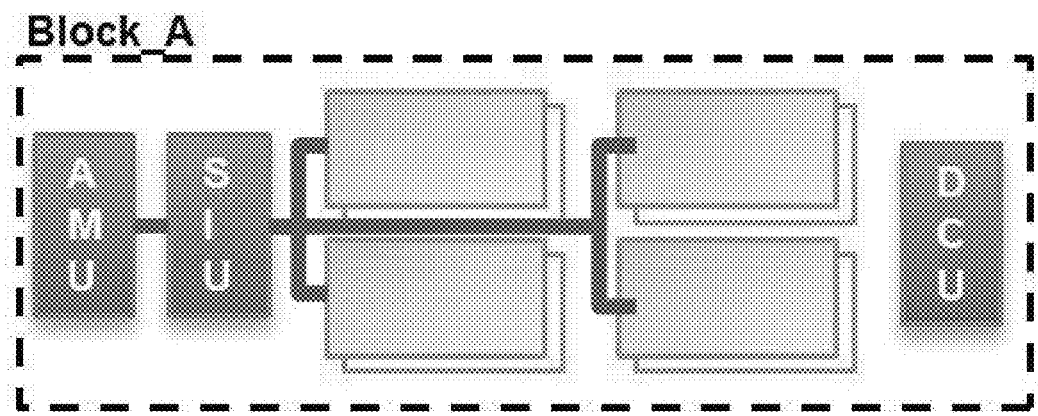
FIGS. 2A and 2B are exemplary schematic diagrams illustrating a block-level PMBIST according to an exemplary embodiment of the present disclosure.
Figure 2B:
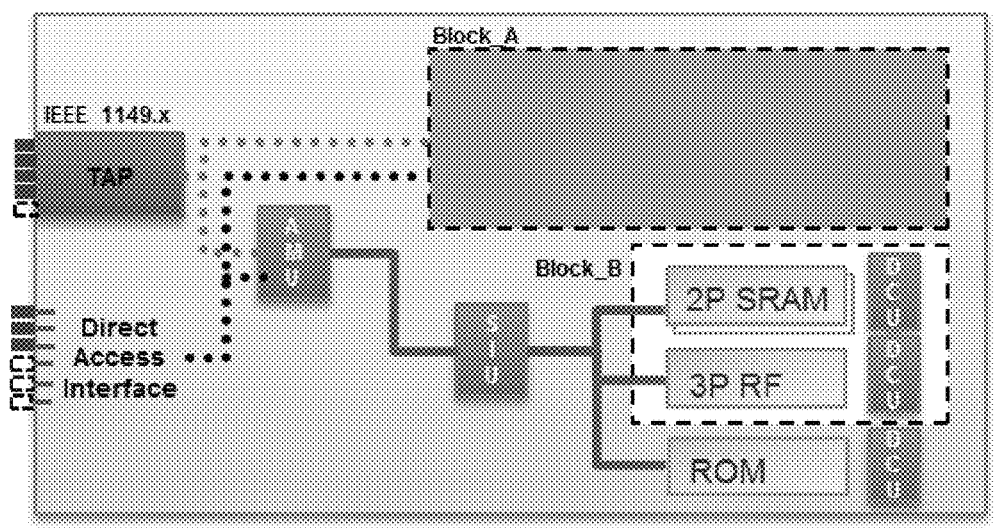

A design for test ("DFT") configuration may be defined for a PMBIST, which may include MBIST clocks, TAMS, and read memory views. Block-level PMBIST interface ports may be connected to user-selected access methods, which may be integrated into the chip level of the MBIST, as discussed below. (See e.g., FIG. 2A). PMBIST interface files, which may represent an abstract model of the added PMBIST logic, may be utilized to import generated interface files (e.g., for customized test algorithms) at the next higher level or the chip-level. (See e.g., FIG. 2B).

Figure 3A:
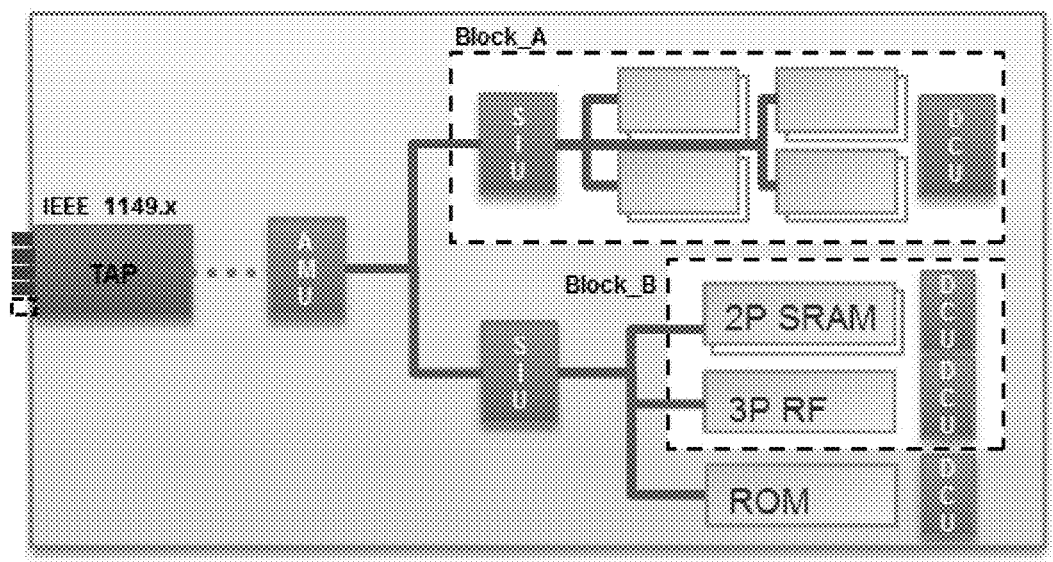
FIG. 3A is an exemplary schematic diagram illustrating the exemplary PMBIST with a JTAG controller according to an exemplary embodiment of the present disclosure.
Figure 3B:
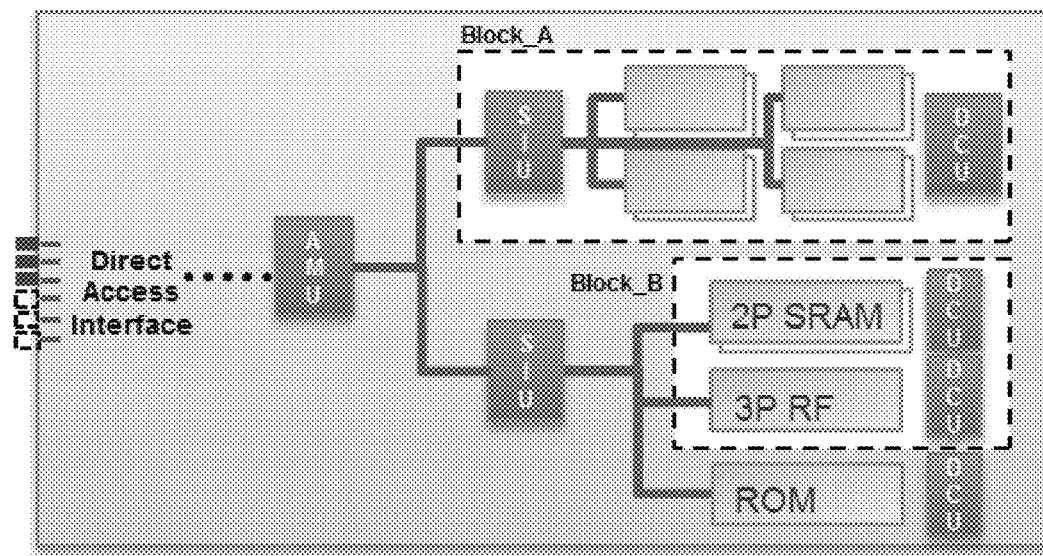
FIG. 3B is an exemplary schematic diagram illustrating the exemplary PMBIST with a direct access controller according to an exemplary embodiment of the present disclosure.

The exemplary PMBIST may be JTAG controlled (see e.g., FIG. 3A) or direct access controlled (see e.g., FIG. 3B). The JTAG controlled PMBIST may support a programmable testplan and a shared comparator, utilizing a JTAG macro. JTAG instructions and registers may be used to access PMBIST logic (e.g., using 4 or 5 TAP pins). The direct access controlled PMBIST may also support a programmable testplan and a shared comparator. However, a JTAG controller may not be needed, and memory testing can be performed without a JTAG Macro. A controller for the direct access method may be created in the AMU. The direct access control PMBIST may facilitate activation of PMBIST execution via a minimally direct access pin interface. It may support either external (e.g., port) or internal (e.g., pin) signal activation. Exemplary PMBIST algorithms may run once, or on a continuous loop as part of burn-in test activity. The exemplary direct access control PMBIST may provide monitoring of the AMU. For example, it may collect PMBIST done and fail indicators to report a pass/fail indication. This may facilitate target-specific failure indication retrieval (e.g., using a shift interface).

Figure 4:
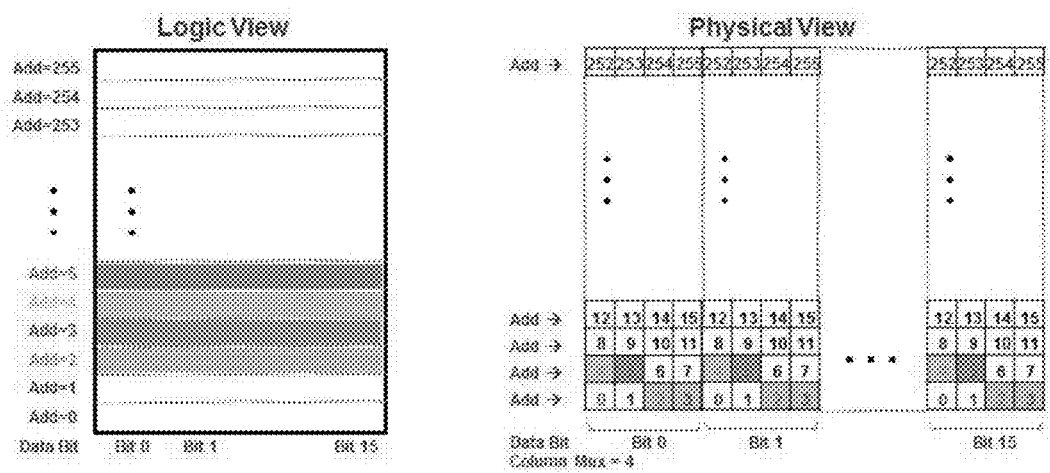
FIG. 4 is an exemplary diagram illustrating an exemplary memory view file according to an exemplary embodiment of the present disclosure.

An exemplary memory view file may be used to describe the exemplary system, method, and computer-accessible medium, according to an exemplary embodiment of the present disclosure. (See e.g., FIG. 4). The memory view may provide a description for a physical memory cell array. The memory view may be laid out in a single column of data, or in multiple columns to optimize the physical layout. A memory module may be included that may identify blocks, and provide external connections with port bindings. A memory wrapper ("MW"), or memory module wrapper, may encapsulate the memory module, which may benefit from the definition of all memory ports. A logical wrapper ("LW"), or logical memory wrapper, may be based on a 1:1 relationship between the memory module and the LW boundary. It may encapsulate the memory module, or MW, with additional discrete logic, facilitating the implementation of various functions such as ECC and repair outside the memory module itself, but within the targeted device. A multi-view memory may be provided, which may be a LW that may support two distinct views of the encapsulated memory. A first view may be the boundary of memory module or MW. The second view may be the boundary of the LW.

Figure 5A:
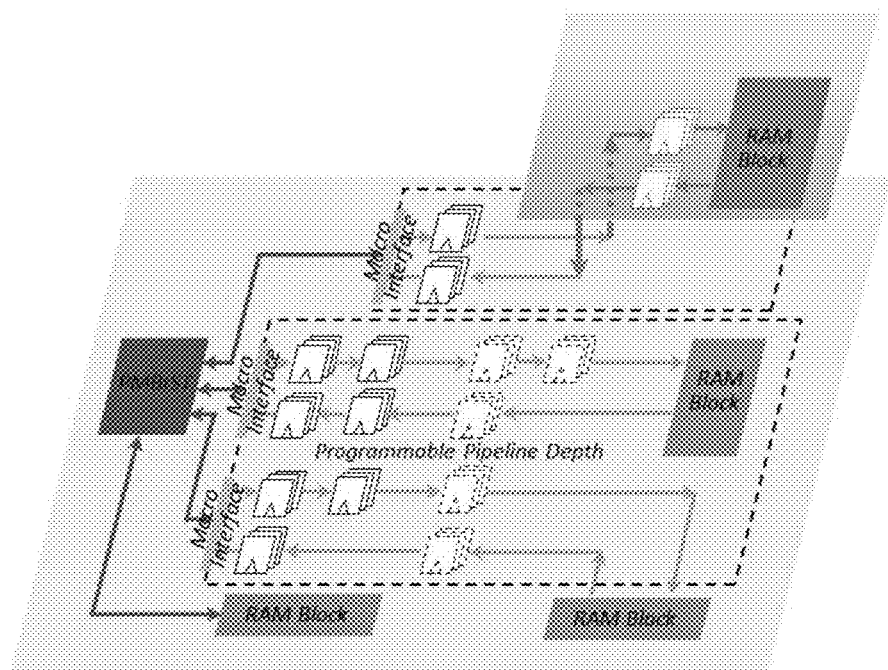
FIG. 5A is an exemplary schematic diagram illustrating an embedded memory bus for a BIST according to an exemplary embodiment of the present disclosure.
Figure 5B:
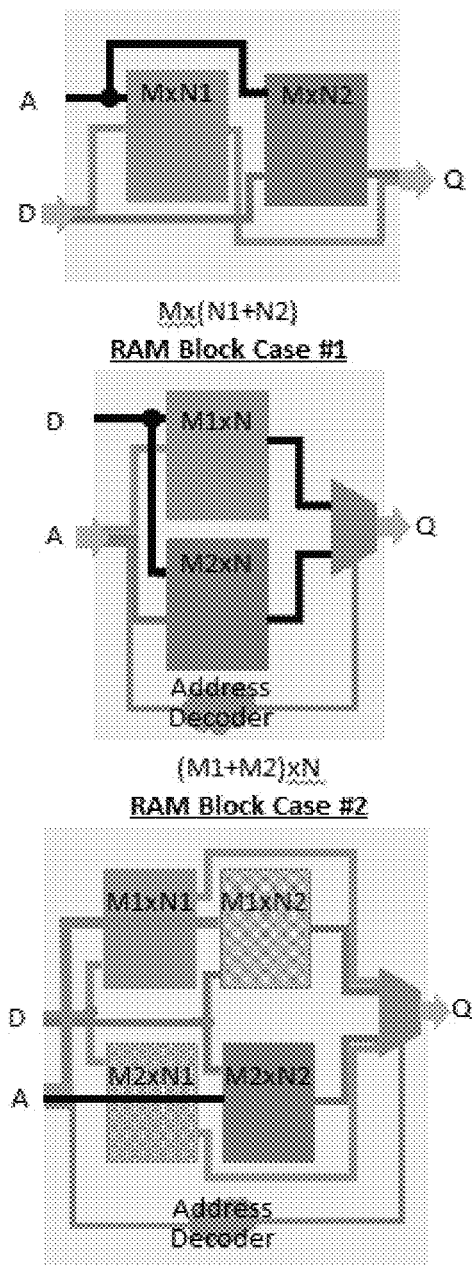
FIG. 5B is a set of schematic diagrams illustrating static and dynamic control signals and support multi-cycle access and a controlled programmable pipeline according to an exemplary embodiment of the present disclosure.

An exemplary macro view may be used to describe an embedded memory bus for BIST purposes. (See e.g., FIG. 5A). The embedded memory may test memories through the defined embedded memory bus. A number of cycle to access memory arrays may be defined, which may be programmable. Logical memory may be used, which may build upon multiple physical memories. The macro view may include mapping from the logical to the physical, and may manage static and dynamic control signals and support multi-cycle access and controlled programmable pipelines. As shown in FIG. 5B, it may include one or more physical memories not necessarily the same size in both dimensions.

Figure 6:
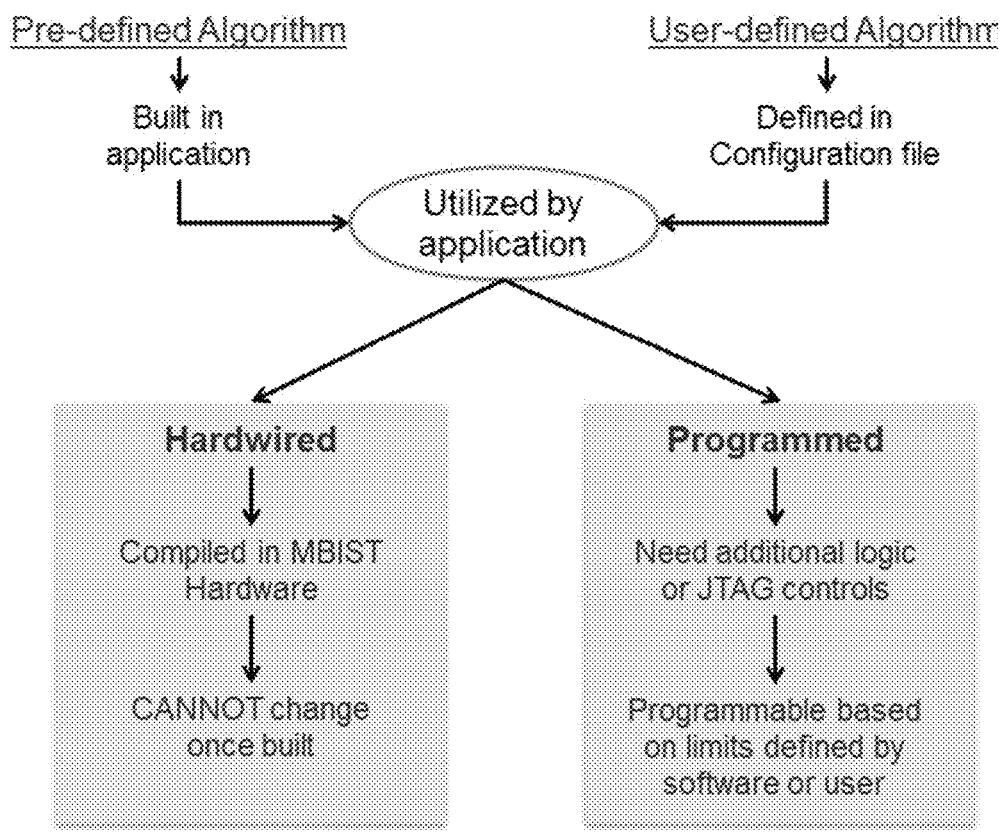
FIG. 6 is an exemplary diagram illustrating exemplary differences between a predefined algorithm (e.g., in current memory units) with the inclusion of user-defined algorithms according to an exemplary embodiment of the present disclosure.

FIG. 6 is an exemplary diagram illustrating exemplary differences between a predefined algorithm, which may be hardwired or programmable, and the inclusion of user-defined algorithms (e.g., programmable algorithms or hardwired algorithms, according to an exemplary embodiment of the present disclosure). Both hardwired and user-defined algorithms may be utilized by an exemplary application. Algorithms hardwired into the AMU, may be compiled in MBIST hardware, and may not be changed after the MBIST hardware is built. In contrast, the exemplary system, method, and computer-accessible medium, according to an exemplary embodiment of the present disclosure, may facilitate the use of user-defined (e.g., programmable or hardwired) algorithms, which may be programmed into the AMU. Additional logic or JTAG controllers may be used in order to implement the user-defined algorithms.

The exemplary system, method, and computer-accessible medium, according to an exemplary embodiment of the present disclosure, may define a set of exemplary registers in one or more register maps (e.g., in one of two register maps). The set of exemplary registers may be defined by a user, which may be accessible at various times by the user. For example, a first exemplary register map may be accessible to the user at the time that the test access method functions (e.g., an interface map ("IMAP") or a control interface register map). The second exemplary register map may be an execution register map ("XMAP"), which may be accessible when the exemplary test procedure is run against the memory. The exemplary XMAP may be controlled by an exemplary AMU.

The exemplary XMAP may support the assignment of input signals to memories using SIU user-defined registers, which may support sampling of output signals from memories into the SIU user-defined registers. AMU testplans may reference these registers using assign and wait statements, and the exemplary SIU hardware may support initial, power-on, values for these registers.

The exemplary IMAP may also support the assignment of input signals to memories using SIU user-defined registers, but may not support sampling of memory output signals. TAM testplans may reference these registers using assign statements, for both JTAG and PMBIST direct access TAMs. A shift state may enable modification of the IMAP content while an update state may control the visibility of the values to the memory input signals. The exemplary SIU hardware may support initial, power-on, values for these registers, which may be implemented within the SIU MBIST test data register.

The exemplary XMAP and IMAP may be utilized to support access to memory ports not normally controlled by memory BIST operations, extending the capabilities for user control and monitoring of the memory unit.

The exemplary XMAP may be used to define a facility that may be made accessible into a boundary of the memory unit (e.g., connected to a signal inside of the memory). Thus, various functions of the memory may be achieved, for example, a power down signal. In particular, a port access statement may be used to define a particular signal to be used (e.g., a value and the size of the signal), which may be controlled during execution time.

Thus, the exemplary system, method, and computer-accessible medium, according to an exemplary embodiment of the present disclosure, may define a procedure that may be accessible at a later point in time by a user (e.g., tester) of the memory. For example, a particular procedure may be defined in the testing of the memory, with an associated start signal. The memory, at a later time during testing, may be accessed using the particular start signal, which will cause the test procedure to run.

Therefore, the exemplary system, method, and computer-accessible medium, according to an exemplary embodiment of the present disclosure, may facilitate access (e.g., direct control) to a specific set of pins in the memory, which may facilitate a user to run a particular procedure defined by the user.

For example, if the user wants to define and assert a power down signal that powers down the memory unit, and then test a read/write procedure on the powered down memory, the user may define a power down signal (e.g., PD) and a value associated therewith (e.g., PD=1). The user may then assert the power down procedure, and test a write function. The user may then power up the memory unit, and perform a read procedure to determine if the power down procedure was achieved. By providing access to certain pins in the memory unit, the features that may be tested in the memory may be extended beyond a standard set of test features. Further, each memory unit testing may be customized for a particular user without the need to modify the memory unit itself (e.g., by modifying the AMU), as the user may define the test being performed, which may be performed by granting access to specific pins in the memory unit (e.g., pins at the boundary of the memory unit).

The exemplary system, method, and computer-accessible medium, according to an exemplary embodiment of the present disclosure, may create a register map that connects to pins on the memory, which may be used to customize control of, or access to, the memory unit. For example, the memory may have certain built in features that, in the past, could not have been accessed by a user during the testing of the circuit at a later date. However, by facilitating access to certain functions in the memory unit, a user may customize their own test procedure.

For example, previously, a user could not use their own read/write procedure to test the memory unit. However, by facilitating access to the memory unit, a particular read/write function may be performed. Specifically, a user may create a procedure whereby all 0's are written to the memory and then the 0's are read from the memory. A user may insert a power down signal into the procedure that initiates a power down of the memory after the 0's have been read and then cause a write procedure to be initiated that writes 1's to the memory. The user may then insert a power up signal, and read the memory to determine if the power down signal was successful (e.g., to determine if the 1's were written to the memory when they should have been). Thus, by providing access to certain functions in the memory unit using the register map, a significant amount of customizable test procedures may be initiated, which may be specific to the user testing the memory unit, which were not previously accessible.

The exemplary system, method, and computer-accessible medium, according to an exemplary embodiment of the present disclosure, may add in a port access statement that defines features of the memory port that may be hardwired, or programmed, based on the needs of the user. For example, the exemplary system, method and computer-accessible medium, may receive a set of programmed test activities and modify the memory unit based on the programmed test activities. Each programmed test activity may have a particular signal associated therewith that may activate the programmed test activity. Thus, when the user tests the memory at a later time, the user may know the available programmed test activities, and may have access to the programmed test activities using the accessible memory pins.

In order to facilitate access to the particular test features, the exemplary system, method and computer-accessible medium, according to an exemplary embodiment of the present disclosure, may receive information pertaining to which bits may be accessed to assign values, which bits may be accessed to receive values, and an exemplary reset state (e.g., the off state), although the reset state may not be needed in some cases.

Exemplary Test Plan

The exemplary test plan may be used to identify one or more procedures to perform when testing the memory unit, and the associated set of conditions to run the procedure. Exemplary procedures may include an address order, an address update, and data backgrounds. The exemplary address order may provide information on how to progress through the memory during testing. For example, how should the test progress through the memory (e.g. rows first and then columns, columns first and then rows, or in a diagonal). The exemplary address update may provide information on how to manipulate the address when moving from one address to the next (e.g., linear from 0 to N and then N to 0). Other exemplary address update procedures may include compliment, two's power, worst case, shifted, next address, and next physical. The exemplary data backgrounds may be used to excite certain types of failures based on a priori knowledge of the physical structure of the memory.

The exemplary system, method and computer-accessible medium, according to an exemplary embodiment of the present disclosure, may perform certain features before the exemplary test procedure are executed. This may be used to perform redundancy analysis and self-repair. An exemplary test plan may be burnt directly into the memory design, or it may be programmable using an external source that may be used to load the exemplary test plan procedures.

Use of exemplary IMAP or XMAP registers may need a definition within the memory view for the memory using two exemplary specifications:

(1) port_alias {base_port label} port_name [,port_name] . . . .

(2) port_access {assign|sample} {port_name|label} inactive_state [tam]

A port_name in the above expressions may be a scalar or vector, and may exist on the boundary of the memory or macro model definition. Aggregates may be created for a common reference using port_alias. While support may be limited to base_port={td, twe}, the support may be extended to all base_ports, which may enable bit-blasted memory support. A label may represent a program name to be found in the exemplary testplan and procedure references. A predefined base_port_name may have a known memory BIST function. The exemplary use of "label" in port_access may be used to identify the program label and its associated assign/sample capability, as well as its initial or inactive state; facilitating the user to define ports on the memory or macro model for either assignment or sampling within the exemplary testplans and procedures.

Figure 7:
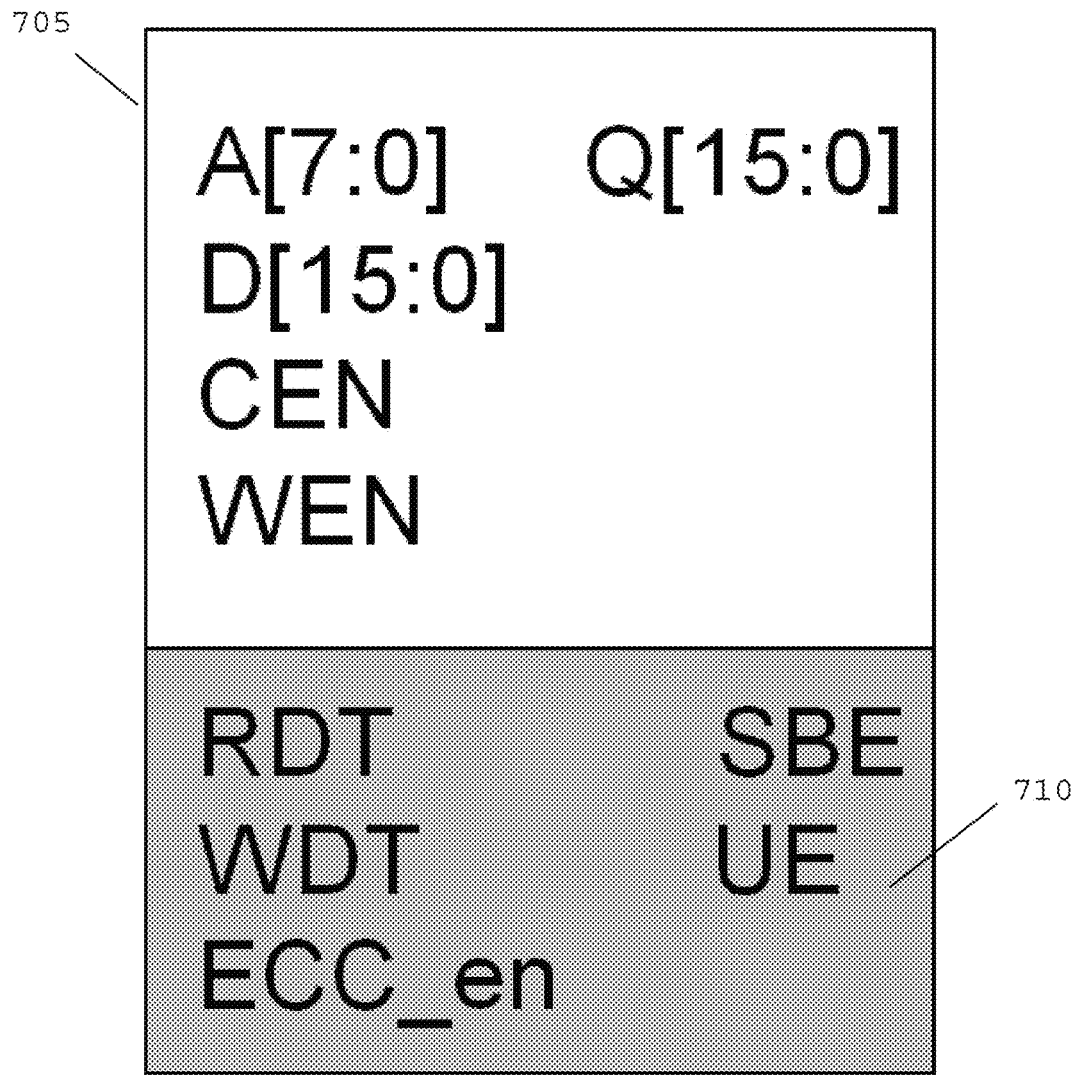
FIG. 7 is an exemplary diagram of an exemplary SRAM unit according to an exemplary embodiment of the present disclosure.

FIG. 7 illustrates a diagram of an SRAM unit 705 according to an exemplary embodiment of the present disclosure. For example, as shown therein, a set of pins in box 710 may represent extended test features that are not "standard" pins generally utilized to test the memory unit and, therefore, they do not receive standardized base_port_ names which may be referenced in port_alias statements. (See e.g., FIG. 8).

The exemplary pins shown in box 710 may be accessible via a port_access statement and potentially a port_alias statement. RDT may be a memory input port which may facilitate a read delay test in which some internal circuitry may affect the read delay paths, stressing the read access. WDT may be similar to RDT, but may affect memory write operations. The exemplary ECC_en memory input port may control whether error correcting codes may be used internally to support fault tolerance within the memory cells. This port may be made accessible via a program label, use_ecc (see e.g., FIG. 8), which may be shared across multiple memories, where the function may be the same, but the memory port name may differ. The combination of the port_access statement defining the label and the port_alias statement binding it to a memory port may be beneficial.

An exemplary SBE memory output port may be asserted 1 when the ECC checking may identify a single-bit correctable error on a read access. The exemplary UCE memory output port may be asserted when the ECC checking may identify an uncorrectable error on a read access.

An exemplary prologue-only AMU testplan may be used to disable ECC operations for full memory cell array accessibility in subsequent testplans. The exemplary testplan may also use address updates and data_backgrounds. The exemplary test plan may be as follows:

```
testplan
{
  name disable_ecc
  address_orders {nu}
  prologue {
    assign use_ecc 0
  }
  hardwired
```

An exemplary AMU procedure may also be used to stress memory reads using RDT. The exemplary AMU procedure may be as follows:

```
algorithm
{
  name stress_rdt
  {
    (w0)
    assign rdt 1
    (r0,w1)
    (r1,w0)
    assign rdt 0
    (r0)
  }
}
```

Figure 9:
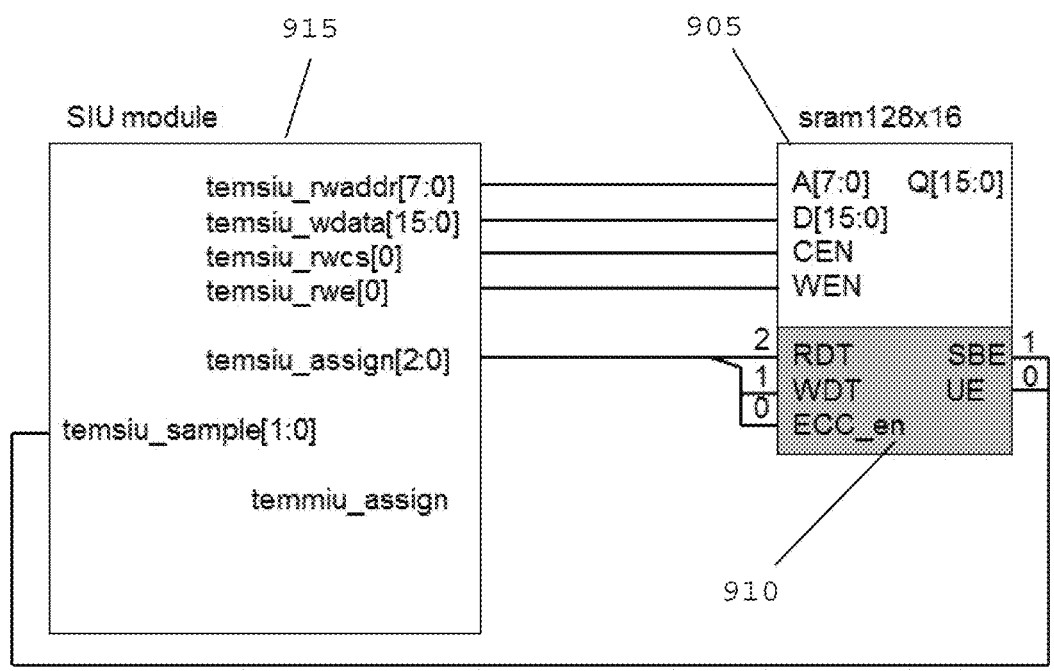
FIG. 9 is an exemplary diagram that illustrates an exemplary SIU module interfaced with an exemplary SRAM unit, having extended test feature support enabled therein, according to an exemplary embodiment of the present disclosure.

FIG. 9 is an exemplary diagram that illustrates an SIU module 915 interfaced with an exemplary SRAM unit 905, having extended test feature support (e.g., pins 910) enabled therein. temsiu_assign and temsiu_sample bits may be connected to appropriate port_access signals. The input pipeline_stages may control the addition of pipelining registers for both buses, based on communication paths between the macro SRAM unit 905 and the boundaries of the SIU module 915. New connections may be provided as a result of the update register being added for selected IMAP entries, which may include, for example, (i) temamu.jtag_updatedr from JTAG module, (ii) temamu.temamu_init_reset to temsiu, and (iii) temamu.temamu_update_mbistsch to temsiu.

The exemplary temsiu_[r]we may be gated externally to the SIU module 915 by a suitable temsiu_[r]wcs signal prior to propagation to a given target. Unless the CS signals for all physical memories are properly OR'ed together, this may not be performed for macro interfaces where a CS is not used. For those macros where CS may be used, all physical memories associated with the macro may have their CS signals logically OR'ed. In order to facilitate this, three new exemplary tem_dcu_pkg file constants may be beneficial to facilitate each physical memory to identify which CS it may control. By performing this function using target decodes within the TAM clock domain, and setting these well in advance of the actual execution, the delay external to the CS registers may be minimized. Thus, CS signals may be created only when necessary.

Exemplary Simplified Grammar

Using the exemplary system, method, and computer-accessible medium, an exemplary grammar may be implemented with very low cost hardware overhead implementation. The exemplary algorithm grammar can include the following:

```
algorithm {
  name algorithm name
  {{
    wait integer|
    pause|
    address_direction (sequence_iterator)} ....
  }
}
address_direction={null|up|u|down|dn|d}
sequence_iterator={memory_access|macro_access}[,
    {memory_access|
macro_access}] ....
macro_access={null|row|col|diag|integer|
  all}(memory access[,memory_access] ... )
memory_access={{-|r|w}{0|1|-}{null|b|m}}
```

An exemplary sequence iterator may be applied on each address of the memory (e.g., in order) and may be represented inside '(' and ')' brackets. These instructions may then be converted into opcodes so that the hardware may understand them and execute the instructions properly.

A comparison of the exemplary grammar compared to standard hardware grammar is presented below for a standard "march_lr" algorithm.

| In text books | Proposed grammar |
| --- | --- |
| ⇕(w0) | (w0) |
| ↓(r0,w1); | dn(r0,w1) |
| ↑(r1,w0,r0,w1); | up(r1,w0,r0,w1) |
| ↑(r1,w0); | up(r1,w0) |
| ↑(r0,w1,r1,w0); | up(r0,w1,r1,w0) |
| ↑(r0) | up(r0) |

As is shown above, all the existing known (or unknown) algorithms may be easily implemented using this exemplary grammar without much support from the PMBIST solution supplier. Opcode may be generated for each and every sequence iterator. Hardware may support the variable length opcodes and may not mandate the length of the opcode to be same for each and every sequence iterator, which reduces the area overhead. Instructions may be implemented inside the hardware in a particular manner to minimize the hardware overhead. A 2-instruction set architecture may be used to implement any algorithm using this exemplary grammar.

These 2 instruction sets may be called (i) a simple instruction set or (ii) a complex instruction set. For the description below, the following can be assumed:

r0 means read 0 from a memory location
r1 means read 1 from a memory location
w0 means write 0 to a memory location
w1 means write 1 to a memory location Exemplary Simple Instruction Set As is shown above there may be 4 different simple operations/instructions provided to a given memory location. To implement 4 states, may utilize 2 bits of information. These simple instructions may be implemented inside the exemplary system, method, and computer-accessible medium using a single bit, thereby reducing the hardware overhead. This may be performed by carefully examining the algorithm and the order of read-write operations. For simple algorithms (e.g., algorithms implemented using simple instruction set), the first operation may be w0; the subsequent write operation may write the inverted value of the previous write value, and any read operation that follows the write operation may read the last written value. Based on the above, the exemplary algorithm may be modelled with 2 states. One may be the write operation and other may be the read operation, which may only utilize only single bit hardware. Any algorithm that is not implemented using simple instructions may be implemented using complex instructions described below.

Exemplary Complex Instruction Set

Any algorithm that cannot be implemented using simple instruction set may be implemented using a complex instruction set. For example, 22 complex instructions may be generated, which may use 5-bits to implement. These complex instructions may be for 2-dimensional algorithms (e.g., if a user wants to read the whole memory after each write operation to a given memory location) or if a user wants to repeat the same write operation at the same location multiple times (e.g., standard 'hamw8' algorithm).

The level of granularity for the simple vs. complex instruction may be at the level of the sequence iterator. Thus, the implementation of a single algorithm can have mix of simple and complex instructions, and the full algorithm may not need to be implemented using either simple or complex instructions, thereby reducing the overall area overhead further.

Since, these algorithms may be specified by the user, which can take place after chip manufacturing, and they may need to be compiled into binary bit-string such that the hardware understands it, some memory may be needed to store the programmable algorithm before executing it. This memory may need to be present on the chip before manufacturing. Thus, there may be another level of optimization in order to store only the single (e.g., largest possible) algorithm from users' list.

Further optimizations may be performed to reduce the number of instructions while converting the algorithm into the binary string of opcodes for processing by the hardware. For example, a sequence iterator (e.g., of an algorithm) can be used to implement complex instruction set like (r0, w1, 8(r1)). The instructions may include 6 complex instructions for 'r0', 'w1', '8', '(', r1, and ')'. This may be implemented using 5 complex instructions for 'r0', 'w1', '8(', 'r1' and ')'. Two instructions ('8' and '(') may be merged into one ('8(')).

An exemplary advantage may be the simplified grammar which may be very close to the text-book style grammar for programmable memory testing algorithms. This may help the user to adopt and write new algorithms with minimum dependency on the vendor providing the MBIST solution. Further, the exemplary grammar may have low area overhead because of 2-instruction set architecture. Additionally, the variable length opcodes for each sequence iterator may be beneficial, which may reduce the area overhead even further.

Figure 10:
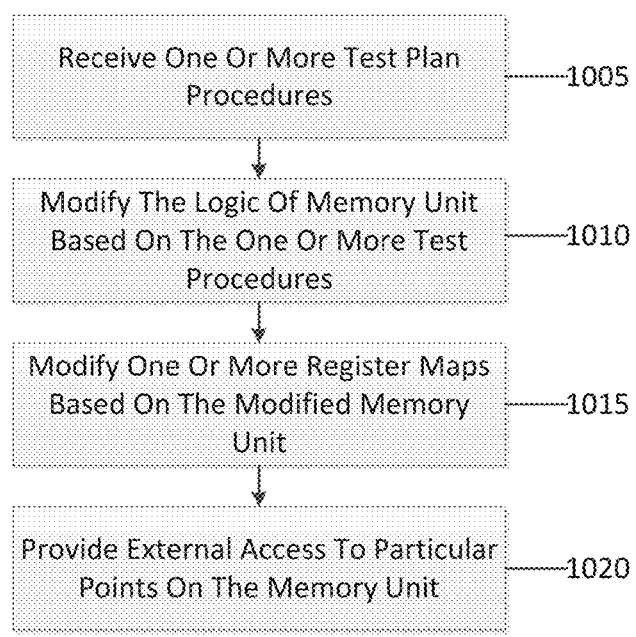
FIG. 10 shows an exemplary flow diagram for providing a user with external access to a memory unit in order to test the memory unit, according to an exemplary embodiment of the present disclosure.

FIG. 10 shows an exemplary flow diagram of a method 1000 for providing a user with external access to a memory unit in order to test the memory unit, according to an exemplary embodiment of the present disclosure. For example, at procedure 1005, one or more test plans may be received from a user that wants to test the memory unit. The test plans may be customized test plans not already present in, or embodied in, the memory unit. For example, a memory unit may have a preprogrammed set of tests present therein. However, a user may want to run additional tests on the memory unit (e.g., a set of customized tests). Based on the customized tests received at procedure 1005, the memory unit may be modified (e.g., customized) at procedure 1010 such that the one or more tests may be performed on the memory unit. Inclusive of the customized tests is information on how to run the test (e.g., an input signal), information on how to stop the test, and a default state for the memory unit based on the test, although such information may not be needed.

At procedure 1015, one or more register maps of the memory unit may be modified based on the modified memory, which may facilitate access by the user to the customized tests. At procedure 1020, external access to the memory unit may be provided, which was not previously present. External access may include signal access to one or more pins at the boundary that may be accessed by a SIU user-defined register. The external access may facilitate a user to run the customized tests previously provided.

Figure 11:
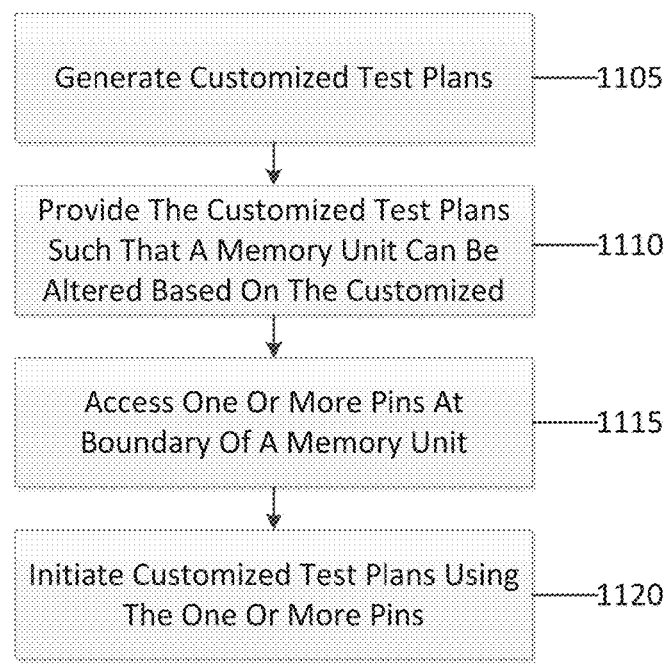
FIG. 11 is an exemplary flow diagram for initiating a customized test on a memory unit according to an exemplary embodiment of the present disclosure.

FIG. 11 shows an exemplary flow diagram of a method 1100 for initiating a customized test on a memory unit according to an exemplary embodiment of the present disclosure. For example, at procedure 1105, a set of customized test plans may be generated. The customized test plans may be user specific, facilitating a user to access non-standard tests in a memory unit not previously provided. At procedure 1110, the customized test plans may be provided to a memory manufacturer or designer, facilitating the modification of the memory unit, including facilitating access to certain boundary pins on the memory unit not previously accessible. At procedure 1115, the boundary pins may be accessed by the user (e.g., using an SIU user-defined register). The user may then initiate the one or more customized tests at procedure 1120, which are specific to that user.

Figure 12:
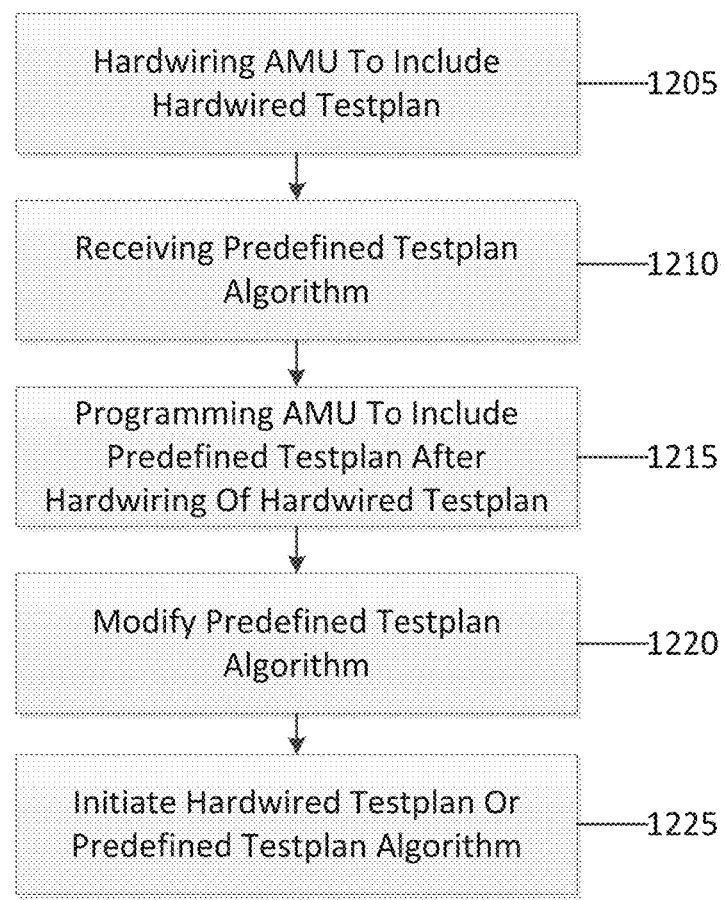
FIG. 12 shows an exemplary flow diagram of a method 1200 for modifying an AMU according to an exemplary embodiment of the present disclosure.

FIG. 12 shows an exemplary flow diagram of a method 1200 for modifying an AMU according to an exemplary embodiment of the present disclosure. For exemplary, at procedure 1205, the AMU may be hardwired (e.g., based on information from a user) to include the hardwired testplan thereon. At procedure 1210, a programmed testplan algorithm may be received (e.g., from a user). At procedure 1215, the AMU may be programmed to include the programmed testplan algorithm after the hardwired testplan has been hardwired on to the AMU. At procedure 1220, the programmed testplan algorithm may be optionally modified. At procedure 1225, the hardware testplan or the programmed testplan algorithm may be initiated to test a memory coupled to the AMU.

Figure 13:
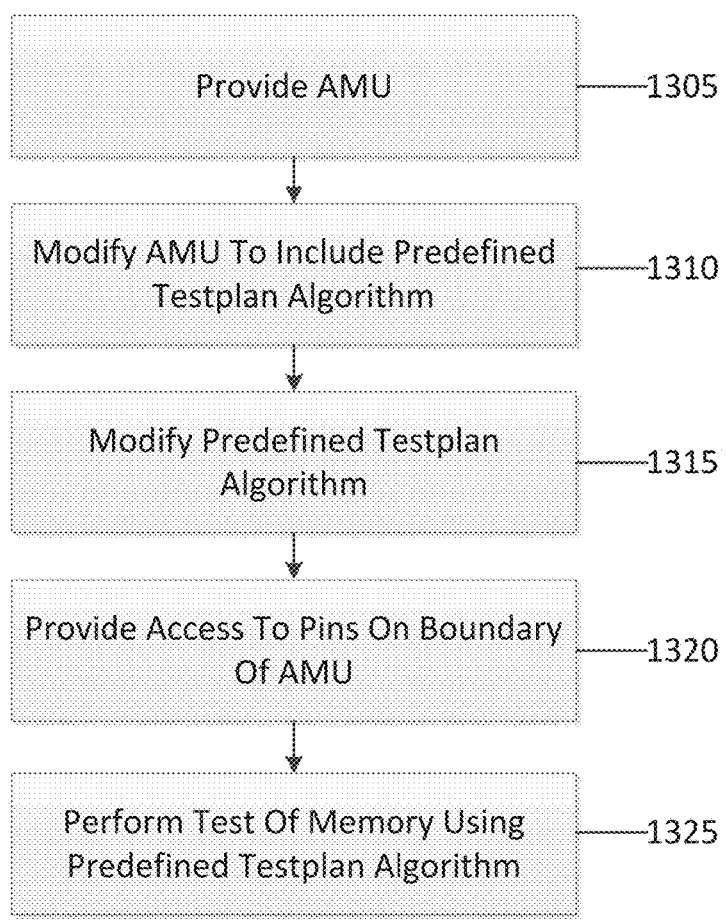
FIG. 13 shows an exemplary flow diagram of a method 1300 for modifying an AMU according to an exemplary embodiment of the present disclosure.

FIG. 13 shows an exemplary flow diagram of a method 1300 for modifying an AMU according to an exemplary embodiment of the present disclosure. For exemplary, at procedure 1305, an AMU may be provided. At procedure 1310, the AMU may be modified to include a programmed testplan algorithm thereon (e.g., which may be based on information from a user). At procedure 1315, the programmed testplan algorithm may be optionally modified. At procedure 1320, access to pins on a boundary of the AMU may be provided. At procedure 1325, a test of a memory coupled to the AMU may be performed using the programmed testplan algorithm.

Figure 14:
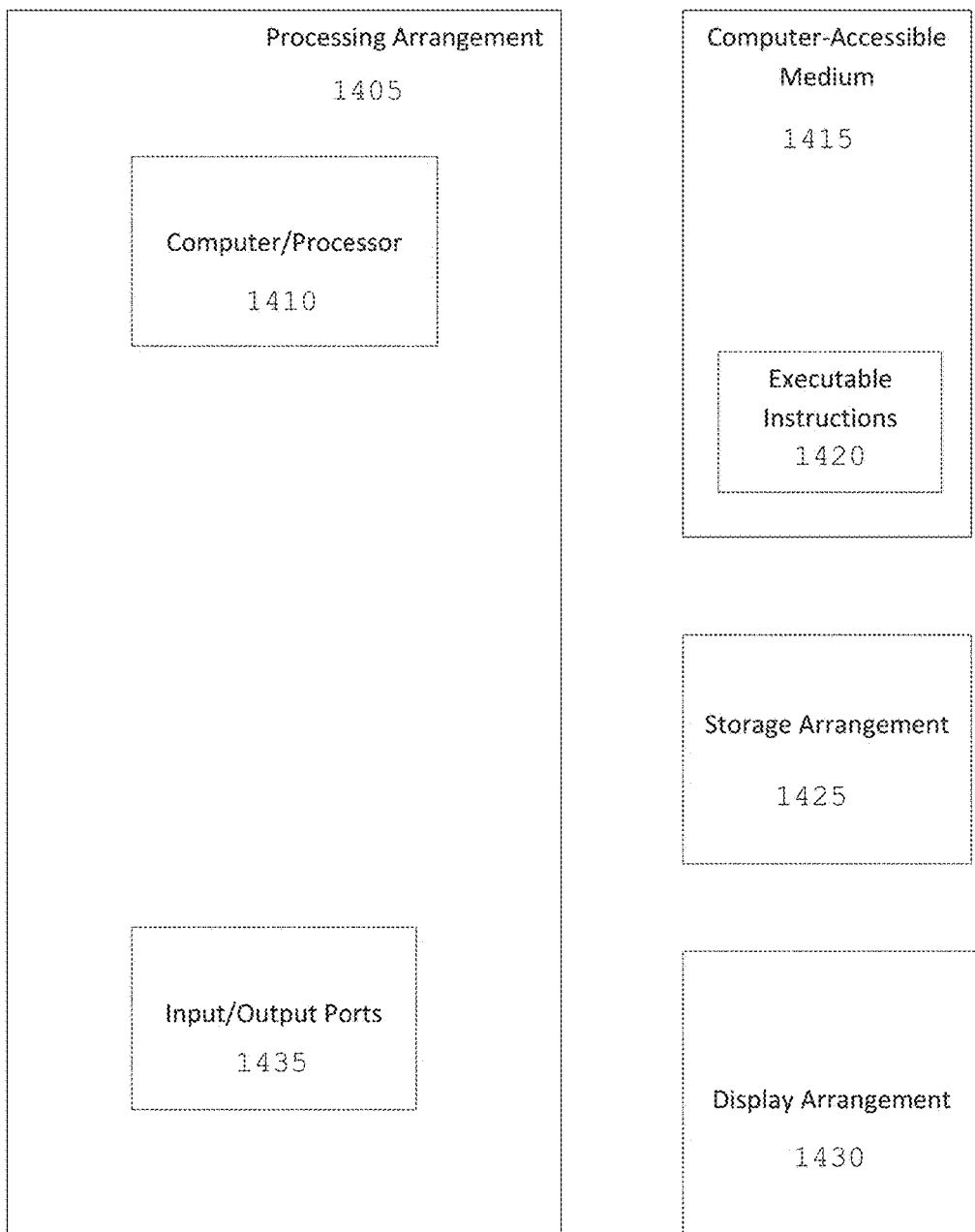
FIG. 14 is an illustration of an exemplary block diagram of an exemplary system in accordance with certain exemplary embodiments of the present disclosure.

FIG. 14 shows a block diagram of an exemplary embodiment of a system according to the present disclosure. For example, exemplary procedures in accordance with the present disclosure described herein may be performed by a processing arrangement and/or a computing arrangement 1405. Such processing/computing arrangement 1405 may be, for example entirely or a part of, or include, but not limited to, a computer/processor 1410 that may include, for example one or more microprocessors, and use instructions stored on a computer-accessible medium (e.g., RAM, ROM, hard drive, or other storage device).

As shown in FIG. 14, for example a computer-accessible medium 1415 (e.g., as described herein above, a storage device such as a hard disk, floppy disk, memory stick, CD-ROM, RAM, ROM, etc., or a collection thereof) may be provided (e.g., in communication with the processing arrangement 1405). The computer-accessible medium 1415 may contain executable instructions 1420 thereon. In addition or alternatively, a storage arrangement 1425 may be provided separately from the computer-accessible medium 1415, which may provide the instructions to the processing arrangement 1405 so as to configure the processing arrangement to execute certain exemplary procedures, processes, and methods, as described herein above, for example.

Further, the exemplary processing arrangement 1405 may be provided with or include an input/output arrangement 1435, which may include, for example a wired network, a wireless network, the internet, an intranet, a data collection probe, a sensor, etc. As shown in FIG. 14, the exemplary processing arrangement 1405 may be in communication with an exemplary display arrangement 1430, which, according to certain exemplary embodiments of the present disclosure, may be a touch-screen configured for inputting information to the processing arrangement in addition to outputting information from the processing arrangement, for example. Further, the exemplary display 1430 and/or a storage arrangement 1425 may be used to display and/or store data in a user-accessible format and/or user-readable format.

The terms "coupled", "coupled to", and "coupled with" as used herein each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, and/or (c) a functional relationship in which the operation of any one or more devices, apparatus, files, programs, media, components, networks, systems, subsystems, or means depends, in whole or in part, on the operation of any one or more others thereof.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and may be thus within the spirit and scope of the disclosure. Various different exemplary embodiments may be used together with one another, as well as interchangeably therewith, as should be understood by those having ordinary skill in the art. In addition, certain terms used in the present disclosure, including the specification, drawings and claims thereof, may be used synonymously in certain instances, including, but not limited to, for example, data and information. It should be understood that, while these words, and/or other words that may be synonymous to one another, may be used synonymously herein, that there may be instances when such words may be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A memory apparatus, comprising:
   at least one memory;
   at least one algorithmic memory unit (AMU), wherein the at least one AMU includes at least one programmed testplan algorithm configured to test the at least one memory; and
   at least one programmable memory built-in self-test (PMBIST) sequence iterator unit (SIU) located between the at least one AMU and the at least one memory configured to control access to a plurality of memory built-in self-test (MBIST) pins on the at least one memory based on the at least one programmed testplan algorithm, wherein the PMBIST SIU includes at least one user-defined sequence iterator shift register configured to control the access to the plurality of MBIST pins.

2. The memory apparatus of claim 1, further comprising at least one of a test controller coupled to the at least one AMU or a direct access controller (DAC) coupled to the at least one AMU.

3. The memory apparatus of claim 2, wherein the test controller is configured to access the PMBIST logic in the at least one programmed testplan algorithm.

4. The memory apparatus of claim 2, wherein the DAC is configured to at least one of (i) access internal nodes in the at least one AMU or (ii) activate the at least one programmed testplan algorithm using at least one of (a) a minimally direct access pin interface in the at least one AMU or (b) at least one external port interface in the at least one AMU.

5. The memory apparatus of claim 1, wherein the at least one AMU further includes at least one hardwired testplan configured to test the at least one memory.

6. The memory apparatus of claim 5, wherein at least one of the at least one programmed testplan algorithm or the at least one hardwired testplan is based on at least one of a simple instruction set or a complex instructions set.

7. The memory apparatus of claim 5, wherein at least one of the at least one programmed testplan algorithm or the at least one hardwired testplan is based on at least one of (i) address_orders, (ii) address_updates, or (iii) data_backgrounds.

8. The memory apparatus of claim 1, wherein the at least one AMU includes a plurality of block-level interface ports.

9. The memory apparatus of claim 5, wherein the at least one hardwired testplan is fixed.

10. The memory apparatus of claim 1, wherein the at least one programmed testplan algorithm is changeable.

11. A non-transitory computer-accessible medium having stored thereon computer-executable instructions for modifying at least one algorithmic memory unit (AMU), wherein, when a computer apparatus executes the instructions, the computer apparatus is configured to perform procedures comprising:
- hardwiring the at least one AMU to include at least one hardwired testplan configured to test at least one memory;
- generating a user-defined sequence iterator shift register in at least one programmable memory built-in self-test (PMBIST) sequence iterator unit (SIU);
- receiving at least one programmed testplan algorithm configured to test the at least one memory;
- programming the at least one AMU to include the at least one programmed testplan algorithm after the at least one AMU has been hardwired to include the at least one hardwired testplan; and
- controlling the PMBIST SIU to test the at least one memory using the at least one hardwired testplan.

12. The computer-accessible medium of claim 11, wherein the computer apparatus is further configured to initiate at least one of (i) the at least one hardwired testplan or (ii) the at least one programmed testplan algorithm.

13. The computer-accessible medium of claim 12, wherein the computer apparatus is configured to initiate the at least one programmed testplan algorithm using at least one of (i) a test controller or (ii) a direct access controller (DAC).

14. The computer-accessible medium of claim 12, wherein the computer apparatus is configured to initiate the at least one programmed testplan algorithm using the DAC by at least one of (i) accessing internal nodes in the at least one AMU or (ii) accessing at least one external port interface in the at least one AMU.

15. The computer-accessible medium of claim 11, wherein the at least one programmed testplan algorithm is received from a user.

16. The computer-accessible medium of claim 11, wherein the computer apparatus is further configured to modify the at least one programmed test plan algorithm.

17. A method for modifying at least one algorithmic memory unit (AMU), comprising:
- providing the at least one AMU;
- coupling at least one programmable memory built-in self-test (PMBIST) sequence iterator unit (SIU) to the at least one AMU;
- programming the at least one AMU to include at least one programmed testplan algorithm; and
- modifying a user-defined sequence iterator shift register in the at least one PMBIST SIU based on the at least one programmed testplan algorithm.

18. The method of claim 17, further comprising providing access to a plurality of pins on a boundary of the at least one AMU.

19. The method of claim 17, further comprising modifying the at least one programmed testplan algorithm.

20. The method of claim 17, further comprising performing a test of a memory coupled to the at least one AMU using the at least one programmed testplan algorithm.

* * * * *